United States Patent [19]

Vaughn

[11] Patent Number: 4,554,467

[45] Date of Patent: Nov. 19, 1985

[54] CMOS FLIP-FLOP

[75] Inventor: Herchel A. Vaughn, Austin, Tex.

[73] Assignee: Motorola, Inc., Schaumburg, Ill.

[21] Appl. No.: 506,959

[22] Filed: Jun. 22, 1983

[51] Int. Cl.[4] .................. H03K 3/289; H03K 17/04; H03K 19/003

[52] U.S. Cl. .............................. 307/279; 307/452; 307/583; 307/585; 307/269

[58] Field of Search ............... 307/452, 453, 481, 576, 307/579, 583, 585, 279, 288, 313, 304

[56] References Cited

U.S. PATENT DOCUMENTS

| T955,006 | 2/1977 | Cavaliere et al. | 307/585 |
|---|---|---|---|
| 3,577,166 | 5/1971 | Yung | 307/288 X |
| 3,676,702 | 7/1972 | McGrogan, Jr. | 307/585 X |
| 3,851,189 | 11/1974 | Moyer | 307/313 X |
| 3,964,031 | 6/1976 | Eaton, Jr. | 307/279 X |
| 4,080,539 | 3/1978 | Stewart | 307/270 X |
| 4,104,860 | 8/1978 | Stickel | 307/279 X |
| 4,216,360 | 8/1980 | Stewart | 307/270 X |
| 4,239,994 | 12/1980 | Stewart | 307/279 X |
| 4,250,406 | 2/1981 | Alaspa | 307/452 |
| 4,484,087 | 11/1984 | Mazin et al. | 307/279 X |

OTHER PUBLICATIONS

Suzuki et al., "Clocked CMOS Calculator Circuitry", IEEE Journal of Solid State Circuits, vol. SC-8, No. 6, Dec. 1973.

Primary Examiner—Stanley D. Miller
Assistant Examiner—David R. Bertelson
Attorney, Agent, or Firm—Anthony J. Sarli, Jr.; Jeffrey V. Myers; James L. Clingan, Jr.

[57] ABSTRACT

A static CMOS delayed flip-flop uses only a weak P channel transistor for reinforcing a logic high at a control node while using a pair of series connected N channel transistors for reinforcing a logic low at the control node. Only a single P channel device is required because it can be made to have sufficiently low gain at a relatively small device size so that the control node can have it logic state switched by an N channel device of comparable size.

6 Claims, 2 Drawing Figures

— PRIOR ART —

CMOS FLIP-FLOP

FIELD OF THE INVENTION

The subject invention relates to flip-flops, and more particularly, to static CMOS delay flip-flops.

BACKGROUND OF THE INVENTION

Some CMOS delay flip-flops use a number of inverters and transmission gates. Each transmission gate includes a P channel and an N channel transistor which are connected in parallel. Due to the difference in conductivity type, one or the other must be in a separate well. For example, the P channel device may be in an N well. Due to this fact, the two transistors which form the transmission gate must be physically separated. The interconnection between the two transistors is thus typically longer than is typical for interconnection between two transistors of the same conductivity type. Interconnection between differing conductivity types increases layout complexity and consequently requires more chip area. It is desirable then to reduce the number of transmission gates as well as reducing transistor count in optimizing use of chip area.

SUMMARY OF THE INVENTION

An object of the subject invention is to provide an improved flip-flop.

Another object of the invention is to provide an improved static CMOS delayed flip-flop which requires less chip area.

Yet another object of the invention is to provide an improved static CMOS delayed flip-flop with a reduced number of transmission gates.

These and other objects of the subject invention are achieved in a CMOS flip-flop which has a transmission gate clocked by true and complementary signals. The transmission gate has an input for receiving an input signal, and an output. An inverter has an input coupled to the output of the transmission gate, and an output. A P channel transistor has a first current electrode coupled to a first power supply terminal, a control electrode coupled to the output of the inverter, and a second current electrode coupled to the input of the inverter. A first N channel transistor has a first current electrode coupled to the input of the inverter, a control electrode coupled to the output of the inverter, and a second current electrode. A second N channel transistor has a first current electrode coupled to the first N channel transistor, a control electrode for receiving the complementary clock signal, and a second current electrode coupled to a second power supply terminal.

DETAILED DESCRIPTION OF THE DRAWINGS

Figure 1:
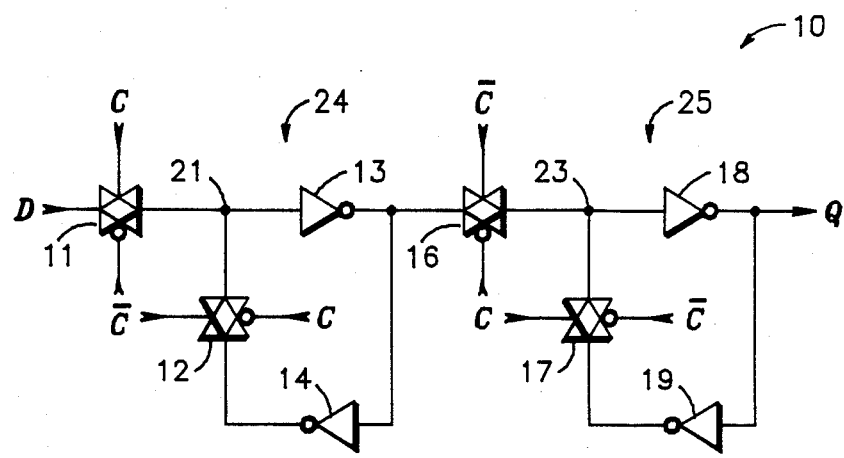
FIG. 1 is a circuit diagram of a static CMOS delayed flip-flop of the prior art.

Shown in FIG. 1 is a static CMOS delayed flip-flop 10 of the prior art comprised of a transmission gate 11, a transmission gate 12, an inverter 13, an inverter 14, a transmission gate 16, a transmission gate 17, an inverter 18, and an inverter 19. Each transmission gate 11, 12, 16, and 17 is a conventional CMOS transmission gate comprised of a P channel transistor and an N channel transistor with a signal input, a signal output, and true and complementary clock inputs, in which the true clock input controls the N channel transistor and the complementary clock input controls the P channel transistor. When the true clock input is a logic high and the complementary clock input is a logic low, a signal on the signal input is coupled to the signal output, and the tranmission gate is considered "on". When the true clock input is at a logic low and the complementary clock input is at a logic high, any signal present on the signal input is prevented from reaching the siqnal Output, and the transmission gate is considered "off". Inverters 13, 14, 18, and 19 are conventional CMOS inverters.

Transmission gate 11 has an input for receiving an input signal D, a true clock input for receiving a true clock signal C, a complementary clock input for receiving a complementary clock signal $\overline{C}$, and an output coupled to a node 21. Clock signal C is present when signal C is a logic high and is not present when signal C is a logic low. Transmission gate 11 is thus connected so as to be "on" when the clock signal is present, or alternatively stated, is connected so as to be "off" when the clock signal is not present. If a transmission gate is connected so as to be "off" when the clock signal is present, then the true clock input receives the complement of clock signal C, and the complementary clock input receives the true clock signal. Transmission gate 12 is so connected, that is, is connected so as to be "off" when the clock signal is present. Transmission gate 12 further has a signal output connected to node 21, and a signal input. Inverter 13 has an input connected to node 21, and an output. Inverter 14 has an input connected to the output of inverter 13, and an output coupled to the signal input of transmission gate 12. Transmission gate 16 has a signal input connected to the output of inverter 13, and a signal output connected to a node 23. Transmission gate 16 is further connected so as to be "off" when clock signal C is present. Transmission gate 17 has a signal output connected to node 23, and a signal input. Transmission gate 17 is further connected so as to be "on" when clock signal C is present. Inverter 18 has an input connected to node 23, and an output for providing an output signal Q. Inverter 19 has an input connected to the output of inverter 18, and an output connected to the input of transmission gate 17. Transmission gates 11 and 12 and inverters 13 and 14 comprise a first stage 24 of flip-flop 10. Transmission gates 16 and 17 and inverters 18 and 19 comprise a second stage 25 of flip-flop 10.

When clock signal C is present, transmission gate 11 is "on" transmission gate 12 is "off". With transmission gate 12 off, the output of inverter 14 is prevented from reaching node 21. With transmission gate 11 "on", signal D is coupled to node 21. Node 21 then becomes the same logic state of signal D. Consequently, the output of inverter 13 assumes the opposite logic state of signal D. While the clock signal is present, the output of inverter 13 will respond to signal D by providing a logic state opposite to that of signal D as an output of first stage 24. When the clock signal switches to a non-present condition, transmission gate 11 is "off" and transmission gate 12 is on. This isolates inverter 13 from signal D while coupling the output of inverter 14 to node 21 to reinforce the logic state at node 21. Consequently the logic state of stage 24 can only be changed when clock signal C is present at which time inverter 14 is decoupled from node 21. Inverter 14 is decoupled from node 21 so that the logic state at node 21 will be easy to change. Only the capacitance at node 21 has to be overcome to change the logic state at node 21. If inverter 14 were not decoupled, then signal D would have to overcome the output drive of inverter 14 in order to change the logic state at node 21. The purpose of transmission gate 12 is to prevent inverter 14 from interfering with signal D changing the logic state at node 21.

The operation of second stage 25 is the same except that the logic state at node 23 can change only when clock signal C is not present and inverter 19 reinforces the logic state at node 23 when clock signal C is present. When clock signal C is not present, transmission gate 16 is "on" so that node 23 assumes the logic state of the output of inverter 13. Inverter 18 then provides signal Q at the logic state opposite to that provided by inverter 13. Because inverter 13 provides its output at a logic state opposite to the logic state that signal D had at a time immediately preceding clock signal C switching from a present to a non-present condition, delay stage 25 provides signal Q at the same logic state as signal D had at that time immediately preceding clock signal C switching from a present to a non-present condition. When signal C switches back to a present condition, transmission gate 16 is "off" and transmission gate 17 is "on". Node 23 is thus isolated from the output of inverter 13 while inverter 19 reinforces the logic state at node 23 so that signal Q remains unchanged. While stage 25 remains unchanged during the presence of clock signal C, stage 24 is responsive to signal D. Then when clock signal C next switches to a non-present condition, signal Q may then switch logic states as dictated by stage 24.

Figure 2:
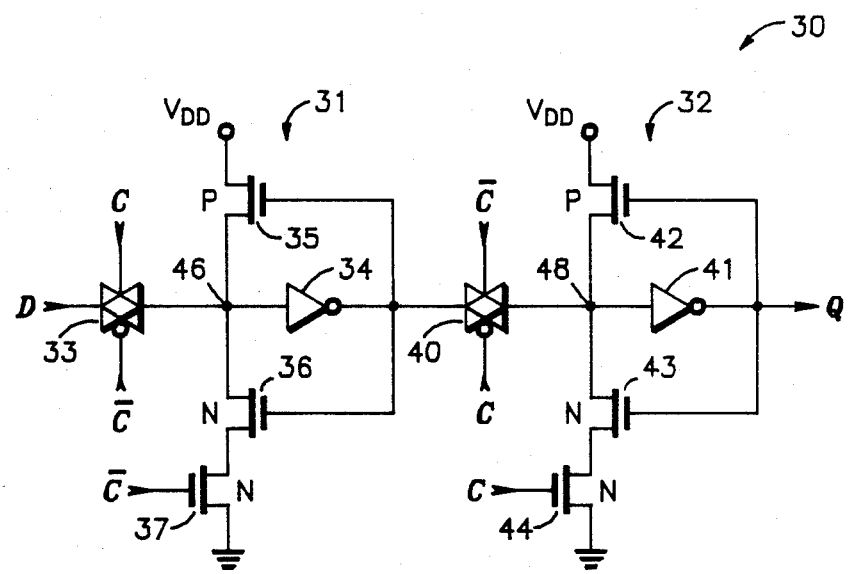
FIG. 2 is a circuit diagram of a static CMOS delayed flip-flop according to a preferred embodiment of the present invention.

Shown in FIG. 2 is a static CMOS delayed flip-flop 30 according to a preferred embodiment of the invention comprised generally of a first stage 31 and a second stage 32. Stage 31 comprises a CMOS transmission gate 33, a CMOS inverter 34, a P channel transistor 35, an N channel transistor 36, and an N channel transistor 37. Stage 32 comprises a transmission gate 40, an inverter 41, a P channel transistor 42, an N channel transistor 43, and an N channel transistor 44. In the particular embodiment described herein, P channel transistors 35 and 42 have a threshold voltage between −0.4 and −0.8 volt, N channel transistors 36, 37, 43, and 44 have a threshold voltage between 0.4 and 0.8 volt, and there is a voltage range of 3 to 6 volts at a positive power supply terminal $V_{DD}$.

Transmission gate 33 has a signal input for receiving input signal D, and a signal output connected to a node 46. Transmission gate 33 is further connected so as to be "on" when clock signal C is present. Inverter 34 has an input connected to node 46, and an output. Transistor 35 has a control electrode connected to the output of inverter 34, a source connected to $V_{DD}$, and a drain connected to node 46. Transistor 36 has a drain connected to node 46, a control electrode connected to the output of inverter 34, and a source. Transistor 37 has a drain connected to the source of transistor 36, a source connected to a negative power supply terminal, shown as ground, and a control electrode for receiving complementary clock signal $\overline{C}$. Transistor 37 is consequently turned on when complementary clock signal $\overline{C}$ is a logic high which is when true clock signal C is a logic low, or alternately stated, transistor 37 is turned on when clock signal C is not present.

Transmission gate 40 has a signal input connected to the output of inverter 34, and a signal output connected to a node 48. Transmission gate 40 is further connected so as to be "off" when clock signal C is present. Inverter 41 has an input connected to node 48, and an output for providing output signal Q. Transistor 42 has a source connected to $V_{DD}$, a control electrode connected to the output of inverter 41, and a drain connected to node 48. Transistor 43 has a drain connected to node 48, a control electrode connected to the output of inverter 41, and a source. Transistor 44 has a drain connected to the source of transistor 43, a control electrode for receiving true clock signal C, and a source connected to ground. Transistor 44 is turned on when clock signal C is a logic high, or alternately stated, transistor 44 is turned on when clock signal C is present. Flip-flop 30 is functionally the same as flip-flop 10 of FIG. 1 in terms of providing signal Q in response to clock signal C and input signal D. Signal Q is provided at the logic state that signal D had at a time immediately preceding clock signal C switching from a present to a non-present condition. Stage 31 functions analogously to stage 24 in that the logic state of inverter 34 is switchable only when clock signal C is present and is reinforced when signal C is not present. Likewise, stage 32 functions analogously to stage 25 in that the logic state of inverter 41 is switchable when signal C is not present and is reinforced when signal C is present. Flip-flop 30 differs by requiring fewer transistors than flip-flop 10. Transmission gate 12 and inverter 14 are replaced by transistors 35–37. Transmission gate 17 and inverter 19 are replaced by transistors 42–44.

For the case where clock signal C is not present, node 46 of stage 31 has its logic state reinforced, thereby reinforcing the logic state of stage 31. If node 46 is a logic high, transistor 35 provides the reinforcement. Inverter 34 provides a logic low to the gate of transistor 35 which turns on transistor 35, causing transistor 35 to couple the voltage at $V_{DD}$ to node 46, thus maintaining a logic high thereat. If node 46, prior to the clock signal being present, was a logic low, its logic state was being reinforced by transistors 36 and 37. With clock signal C present, transistor 37 is turned off which thus blocks the path between node 46 and ground, thereby eliminating the reinforcement of the logic low at node 46. Signal D can thus easily change the logic state at node 46 to a logic high. If node 46 was previously a logic high, its logic state was reinforced by transistor 35. There is, however, no additional transistor in series with transistor 35 between node 46 and $V_{DD}$ to interrupt the reinforcement when the clock signal is present. No such transistor is necessary. Advantage is taken of N channel transistors having about three times the gain of P channel transistors in a typical CMOS process for a given gate width to length ratio. If signal D is a logic low, thus requiring node 46 to switch from a logic high to a logic low, signal D will be driven by an N channel transistor (not shown) which can easily overpower P channel transistor 35 which is made intentionally of very low gain.

Gain can be increased by increasing gate width or decreasing gate length. Gain is typically increased by increasing width with the length held at the minimum length, for example, 3 microns. Consequently, increasing gain normally means increased size. Conversely gain can be decreased by decreasing gate width or increasing gate length. If gain is decreased by decreasing width, then size is reduced. There is, however, a limit for decreasing width. In a given process there is a minimum gate width, for example, 4 microns, for transistors. Further decreases in gain can be achieved only by increasing length which increases size. For chip area reasons, the optimum transistor size is at or near the minimum width and length.

For flip-flop 30, P channel transistor 35 and the N channel driver transistor (not shown) for signal D can be near the optimum transistor size and still have reliable functional operation because the N channel has sufficient gain to pull node 46 to a logic zero even with transistor 35 turned on. Although transistor 36 could also be made sufficiently weak to be overpowered, it would require that transistor 36 be of very long gate length. The problem is compounded because a P channel transistor (not shown) is the driver for signal D when signal D is a logic high. Consequently, for node 46 to switch from a logic low to a logic high would require a P channel transistor to overpower an N channel transistor if intervening transistor 37 were not used. Absent transistor 37, for transistor 36 to be made sufficiently weak, the required gate length would make transistor 36 prohibitively larger.

Stage 32 is the same as stage 31 except that the logic state is switchable when the clock is not present and is in a latch mode when the clock signal is present. Transmission gate 40 is "on" when the clock signal is not present which allows node 48 to assume the logic state of inverter 34. If node 48 was at a logic high, it was reinforced by transistor 42 in the same way that transistor 35 reinforced node 46 when node 46 was at a logic high. Even though reinforcing transistor 42 does not turn off until inverter 41 switches to a logic high output, node 48 can be pulled to a logic low by inverter 34 because an N channel transistor of inverter 34 can overpower transistor 42 while maintaining near optimum sizes for both the N channel transistor of inverter 34 and transistor 42. For the case where a logic low was present at node 48 and the output of inverter 34 is at a logic high, transistor 43 is prevented from reinforcing the logic low by intervening transistor 44 which is turned off when clock signal C is not present.

When clock signal C is present, transmission gate 40 is "off", isolating node 48 from inverter 34. Transistor 44 is turned on so that transistor 43 can provide reinforcement of a logic low at node 48. Transistor 42 provides reinforcement for a logic high. Output signal Q is thus reliably held at the desired logic state.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of this invention.

I claim:

1. A CMOS flip-flop, comprising:

a first controllable switch, having an input for receiving an input signal, and an output, for coupling the input signal to the output when a clock signal is at or near a voltage present at a first power supply terminal and for preventing the input signal from reaching the output when the clock signal is at or near a voltage at a second power supply terminal;

a first inverter having an input coupled to the output of the first controllable switch, and an output;

a first P channel transistor having a first current electrode directly connected to the first power supply terminal with no intervening elements therebetween, a control electrode coupled to the output of the first inverter, and a second current electrode directly connected to the input of the first inverter with no intervening elements therebetween;

a first N channel transistor having a first current electrode coupled to the input of the first inverter, a control electrode coupled to the output of the first inverter, and a second current electrode; and a second N channel transistor having a first current electrode coupled to the second current electrode of the first N channel transistor, a control electrode for receiving a signal complementary to the clock signal, and a second current electrode coupled to the second power supply terminal.

2. The CMOS flip-flop of claim 1, comprising:

a second controllable switch clocked by the signal complementary to the clock signal and having an input coupled to the output of the first inverter, and an output;

a second inverter having an input coupled to the output of the second controllable switch, and an output;

a second P channel transistor having a first current electrode directly connected to the first power supply terminal with no intervening elements therebetween, a control electrode coupled to the output of the second inverter, and a second current electrode directly connected to the input of the second inverter with no intervening elements therebetween;

a third N channel transistor having a first current electrode coupled to the input of the second inverter, a control electrode coupled to the output of the second inverter, and a second current electrode; and a fourth N channel transistor having a first current electrode coupled to the second current electrode of the third N channel transistor, a control electrode for receiving the clock signal, and a second current electrode coupled to the second power supply terminal.

3. The CMOS flip-flop of claim 2 wherein the first and second controllable switches are transmission gates clocked by the clock signal and the signal complementary to the clock signal.

4. A CMOS flip-flop, comprising:

a first controllable switch, having an input for receiving an input signal, and an output, for coupling the input signal to the output when a clock signal is at or near a voltage present at a first power supply terminal and for preventing the input signal from reaching the output when the clock signal is at or near a voltage at a second power supply terminal;

a first inverter having an input coupled to the output of the first controllable switch, and an output;

a first P channel transistor having a first current electrode directly connected to the first power supply terminal with no intervening elements therebetween, a control electrode coupled to the output of the first inverter, and a second current electrode directly connected to the input of the first inverter with no intervening elements therebetween; and a first pair of series-coupled N channel transistors coupled between the input of the first inverter and the second power supply terminal, wherein one of the first pair has a control electrode coupled to the output of the first inverter and the other of the pair has a control electrode for receiving a signal complementary to the clock signal.

5. The CMOS flip-flop of claim 4 further comprising:
a second controllable switch clocked by the signal complementary to the clock signal and having an input coupled to the output of the first inverter, and an output:
a second inverter having an input coupled to the output of the second controllable switch, and an output;
a second P channel transistor having a first current electrode directly connected to the first power supply terminal with no intervening elements therebetween, a control electrode coupled to the output of the second inverter, and a second current electrode directly connected to the input of the second inverter with no intervening elements therebetween; and
a second pair of series-coupled N channel transistors coupled between the input of the second inverter and the second power supply terminal, wherein one of the second pair has a control electrode coupled to the output of the second inverter and the other of the pair has a control electrode for receiving the clock signal.

6. The CMOS flip-flop of claim 5 wherein the first and second controllable switches are transmission gates, each clocked by the clock signal and the signal complementary to the clock signal.

* * * * *